United States Patent
Chang et al.

(10) Patent No.: US 10,267,827 B2
(45) Date of Patent: Apr. 23, 2019

(54) POWER ON DETECTION CIRCUIT

(71) Applicants: Taiwan Semiconductor Manufacturing Co., Ltd., Hsin-Chu (TW); Global Unichip Corporation, Hsin-Chu (TW)

(72) Inventors: Chun-Chi Chang, Xinzhuang (TW); Chia-Hsiang Chang, Pingzhen (TW); Jun-Chen Chen, Zhubei (TW)

(73) Assignees: Taiwan Semiconductor Manufacturing Co., Ltd., Hsin-Chu (TW); Global Unichip Corporation, Hsin-Chu (TW)

( * ) Notice: Subject to any disclaimer, the term of this patent is extended or adjusted under 35 U.S.C. 154(b) by 0 days.

(21) Appl. No.: 14/462,600

(22) Filed: Aug. 19, 2014

(65) Prior Publication Data
US 2014/0354306 A1    Dec. 4, 2014

Related U.S. Application Data

(63) Continuation of application No. 12/828,437, filed on Jul. 1, 2010, now Pat. No. 8,823,418.

(60) Provisional application No. 61/243,222, filed on Sep. 17, 2009.

(51) Int. Cl.
*G01R 17/02* (2006.01)
*G01R 19/00* (2006.01)
*H03K 17/22* (2006.01)

(52) U.S. Cl.
CPC ......... *G01R 17/02* (2013.01); *G01R 19/0084* (2013.01); *H03K 17/223* (2013.01)

(58) Field of Classification Search
CPC ....... G01R 17/02; G01R 19/0084; G06F 1/24; H03K 17/223
USPC .......... 327/52, 56, 57, 77, 78, 142, 143, 198
See application file for complete search history.

(56) References Cited

U.S. PATENT DOCUMENTS

| | | | |
|---|---|---|---|
| 3,956,708 A | 5/1976 | Musa | |
| 5,359,233 A | 10/1994 | Mumper et al. | |
| 5,440,254 A | 8/1995 | Sundby | |
| 5,485,111 A | 1/1996 | Tanimoto | |
| 5,867,047 A | 2/1999 | Kraus | |
| 6,873,193 B2 | 3/2005 | Kinoshita et al. | |
| 7,274,226 B2* | 9/2007 | Yoshizawa | H03K 17/223 327/142 |
| 7,466,172 B2 | 12/2008 | Liu | |

(Continued)

*Primary Examiner* — Lincoln D Donovan
*Assistant Examiner* — Colleen J O Toole
(74) *Attorney, Agent, or Firm* — Duane Morris LLP

(57) ABSTRACT

A power-on-detection (POD) circuit includes a detection circuit, first and second comparison circuits, and logic circuitry. The detection circuit includes a capacitor configured to charge from a first voltage level to a second voltage level. The first comparison circuit is configured to compare a third voltage level to a reference voltage level, and the second comparison circuit is configured to compare a fourth voltage level to the reference voltage level. The third and fourth levels are based on the second voltage level. The logic circuitry is coupled to an output of the first comparison circuit and to an output of the second comparison circuit and is configured to output a power identification signal based on the outputs of the first and second comparison circuits. The detection circuit is configured to turn on the first and second comparison circuits based on a voltage level of the capacitor.

18 Claims, 9 Drawing Sheets

(56) References Cited

U.S. PATENT DOCUMENTS

| | | |
|---|---|---|
| 7,639,052 B2 | 12/2009 | Xiao et al. |
| 7,873,856 B2 * | 1/2011 | Westwick .............. H03K 17/22 |
| | | 327/539 |
| 2008/0079467 A1 | 4/2008 | Hou |

* cited by examiner

POWER ON DETECTION CIRCUIT

CROSS REFERENCE TO RELATED APPLICATIONS

This application is a continuation of U.S. patent application Ser. No. 12/828,437, filed Jul. 1, 2010, now U.S. Pat. No. 8,823,418, which claims priority to U.S. provisional patent application Ser. No. 61/243,222 filed on Sep. 17, 2009, the entireties of which are incorporated by reference herein.

FIELD OF DISCLOSURE

The disclosed systems and methods relate to integrated circuits. More specifically, the disclosed systems and methods relate to power-on-detection (POD) circuits for integrated circuits.

BACKGROUND

Power-on detection ("POD") circuits, sometimes also referred to as "power detect", "power-on-reset", "power enable", or "voltage detect" circuits, generally provide a power-on signal that identifies when the voltage level of a power supply voltage source has attained a predetermined acceptable level. Such circuits are typically implemented in a semiconductor device to prevent malfunctions from occurring when a power supply voltage is applied to the semiconductor device. When the semiconductor device is operated before the power supply voltage reaches the suitable operational level, abnormal operations may occur that may cause device failure. Accordingly, a reset signal resets the semiconductor device if a power supply voltage has been applied but does not reached a predetermined voltage level. The reset signal is released after the power supply has reached the predetermined voltage level range.

FIG. 1 illustrates one example of a conventional POD circuit 100. As shown in FIG. 1, the POD circuit 100 includes an array of resistors 104, switches 112, 114, an inverter 118, and a comparator 102. The resistor array 104 includes resistors 106, 108, and 110 coupled in series between a voltage source VDD and ground. Switch 112 is coupled to node 118, which is disposed between resistors 106 and 108, and to node 122, which is coupled to an input of comparator 102. Switch 114 is also coupled to node 122 and to node 120, which is disposed between resistors 108 and 110. The opening and closing of switches 112 and 114 is controlled by the feedback from the output of the comparator 102. As shown in FIG. 1, switch 112 receives feedback directly from the output of comparator 102, and switch 114 receives feedback from comparator 102 through inverter 118, which is coupled to node 116 at the output of comparator 102.

Comparator 102 compares the voltage received at node 122 from either node 118 or 120 with the reference voltage, VREF. The comparator will output a logic "1" or a logic "0" depending on whether the voltage received from node 122 is greater than or less than the reference voltage. For example, the comparator may output a logic "0" if the reference voltage is greater than the voltage at node 122 and output a logic "1" if the reference voltage is less than the voltage at node 122. The output of comparator 102, RSN, is used as the power-on-reset signal.

FIG. 2 illustrates another example of a conventional POD circuit 200. As shown in FIG. 2, the POD circuit includes first and second comparators 202A, 202B (collectively referred to as "comparators 202"), an array of resistors 204, and logic circuitry 212. The resistor array 204 includes resistors 206, 208, 210 coupled in series between voltage source VDD and ground. Comparator 202A receives a bandgap voltage, VREF, as one input and a voltage from node 214 as a second input. Similarly, comparator 202B receives the reference voltage, VREF, as one input and a voltage from node 216 as a second input. The comparators 202 compare the voltages received from nodes 214 and 216 to the reference voltage, VREF, and outputs a logic "1" or a logic "0" based on the comparison. For example, if voltage received from node 214 is greater than the reference voltage, VREF, then comparator 202A may output a logic "1" and vice versa. Logic circuitry 214 typically includes a plurality of logic gates and receives the outputs from the comparators 202 as inputs. The logic circuitry 214 outputs a power-on-reset signal, RSN, based on the signals received from the comparators 204. However, each of the POD circuits 100, 200 is susceptible to generating an undesirable false power on or reset signal.

Accordingly, an improved POD circuit is desirable.

SUMMARY

In some embodiments, a power-on-detection (POD) circuit includes first and second comparators, a voltage divider, a detection circuit, and logic circuitry. Each of the first and second comparators have first and second inputs. The first inputs of the first and second comparators receive a reference voltage potential from a reference voltage source node. The voltage divider includes first, second, and third resistors. The first and second resistors are coupled together at a first node, and the second and third resistors are coupled together at a second node. The second input of the first comparator is coupled to the first node, and the second input of the second comparator is coupled to the second node. The detection circuit is coupled between a first voltage source node and the first resistor of the voltage divider. The detection circuit generates a control signal in response to the first voltage source node having a voltage potential higher than ground. The control signal controls the turning on and off of the first and second comparators. The logic circuitry is coupled to outputs of the first and second comparators and outputs a power identification signal based on the outputs of the first and second comparators.

In some embodiments, a power-on-detection (POD) circuit includes first and second comparator circuits each having first and second inputs, a voltage divider circuit, a detection circuit, and logic circuitry. The first inputs of the first and second comparator circuits are coupled to a reference voltage node having a reference voltage potential. The voltage divider circuit having first and second nodes. The first node is coupled to the second input of the first comparator circuit, and the second node is coupled to the second input of the second comparator circuit. The detection circuit is coupled between a first voltage source node and the voltage divider circuit. The detection circuit generates a control signal in response to the first power supply having a higher voltage potential than ground. The control signal controls the turning on and off of the first and second comparator circuits. The logic circuitry is coupled to outputs of the first and second comparator circuits and outputs a power identification signal based on signals received from the outputs of the first and second comparator circuits.

DETAILED DESCRIPTION

Figure 3A:
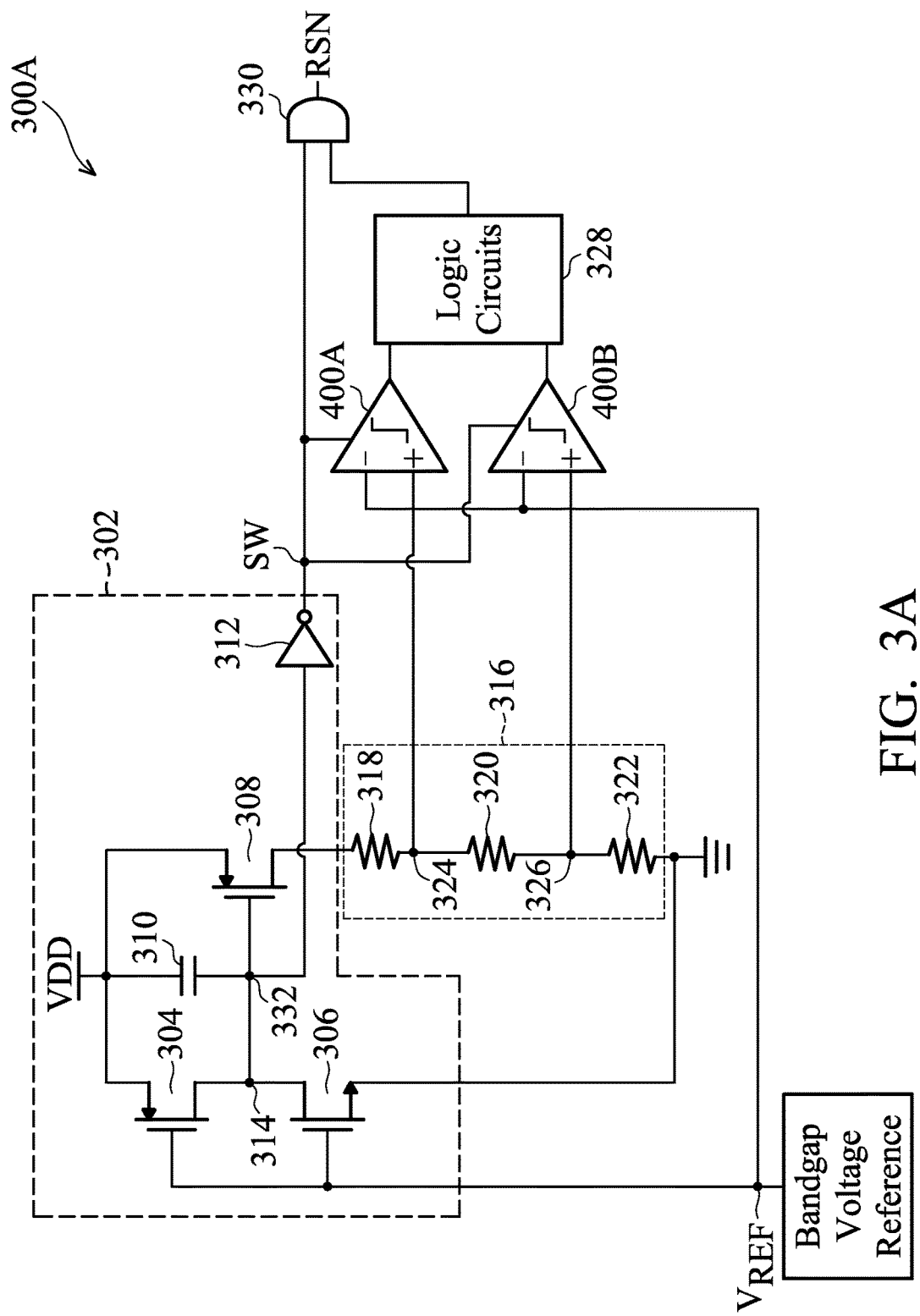
FIGS. 3A-3C illustrate various examples of an improved POD circuits.

FIG. 3A illustrates one example of an improved POD circuit 300A. As shown in FIG. 3A, the POD circuit 300A includes detection circuit 302, voltage divider 316 having resistors 318, 320, 322 coupled in series with the detection circuit 302, first and second comparators 400A, 400B, logic circuitry 328, and an AND gate 330. The detection circuit 302 includes transistors 304, 306, 308, a capacitor 310, and an inverter 312.

P-channel MOSFET transistor 304 and N-channel MOSFET transistor 306 receive a bandgap voltage reference, VREF, at their gates and have their drains coupled to one another at node 314. Note that in some embodiments, such as the one illustrated in FIG. 3B, the gate of transistor 304 in detection circuit 302' may be coupled to ground instead of to the reference voltage, VREF. Referring again to FIG. 3A, the source of transistor 304 is coupled to voltage source VDD, and the source of transistor 306 is coupled to ground. P-channel MOSFET transistor 308 has its source coupled to voltage source VDD and its drain coupled to the drains of transistors 304 and 306 at node 314. At node 332, the gate of transistor 308 is also coupled to capacitor 310, which is also coupled to voltage source VDD. The drain of transistor 308 is coupled to resistor 318. The input of inverter 312 is coupled to capacitor 310 at node 332 and the output is coupled to an input of AND gate 330.

Comparator 400A receives the reference voltage, VREF, as one input and a voltage from node 324 disposed between resistors 318 and 320 as a second input. Comparator 400B receives the reference voltage, VREF, as one input and a voltage from node 326 disposed between resistors 320 and 322 as a second input. The outputs of comparators 400A and 400B are input into the logic circuitry 328, which outputs a signal to AND gate 330.

Figure 3B:
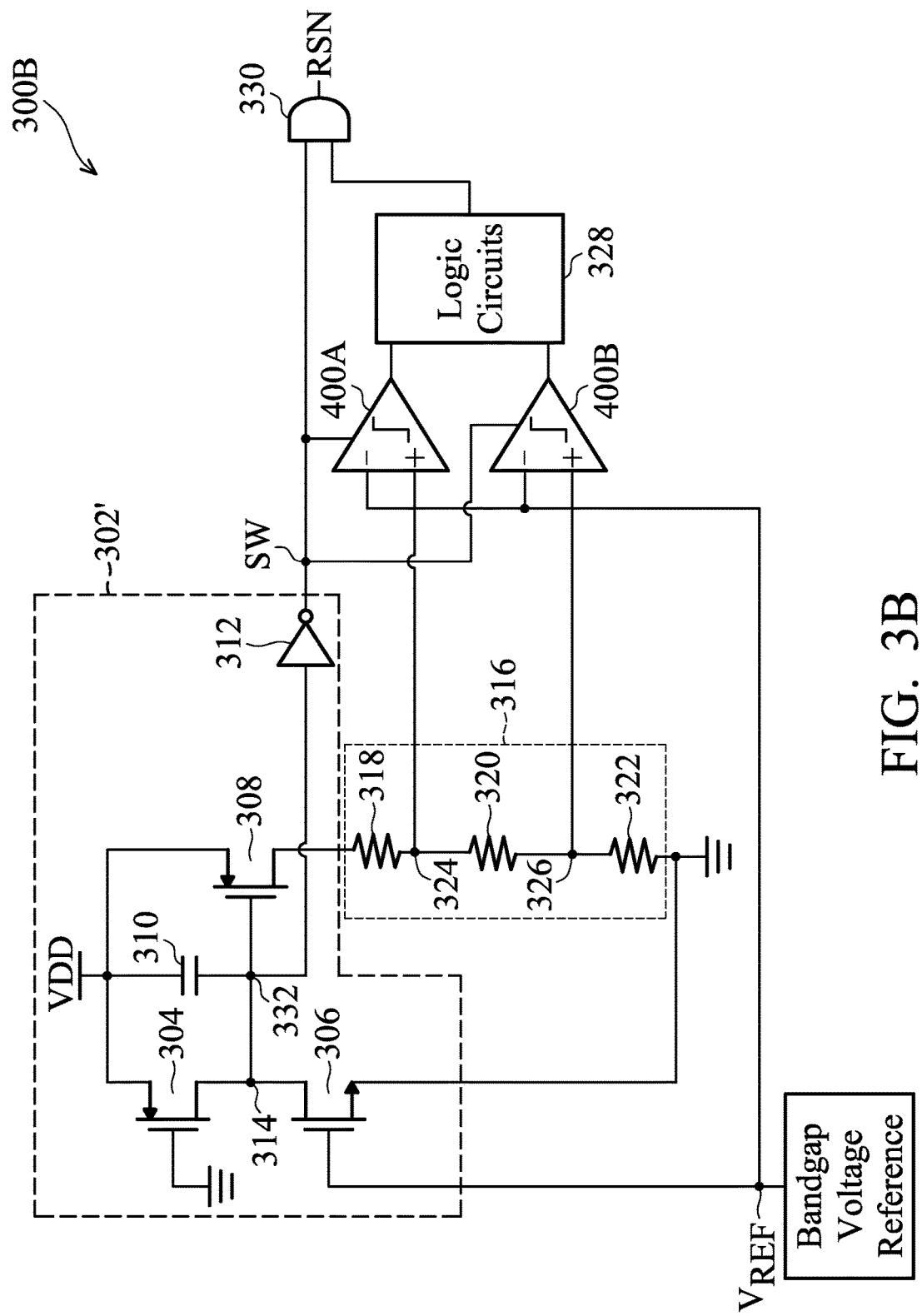
Figure 3C:
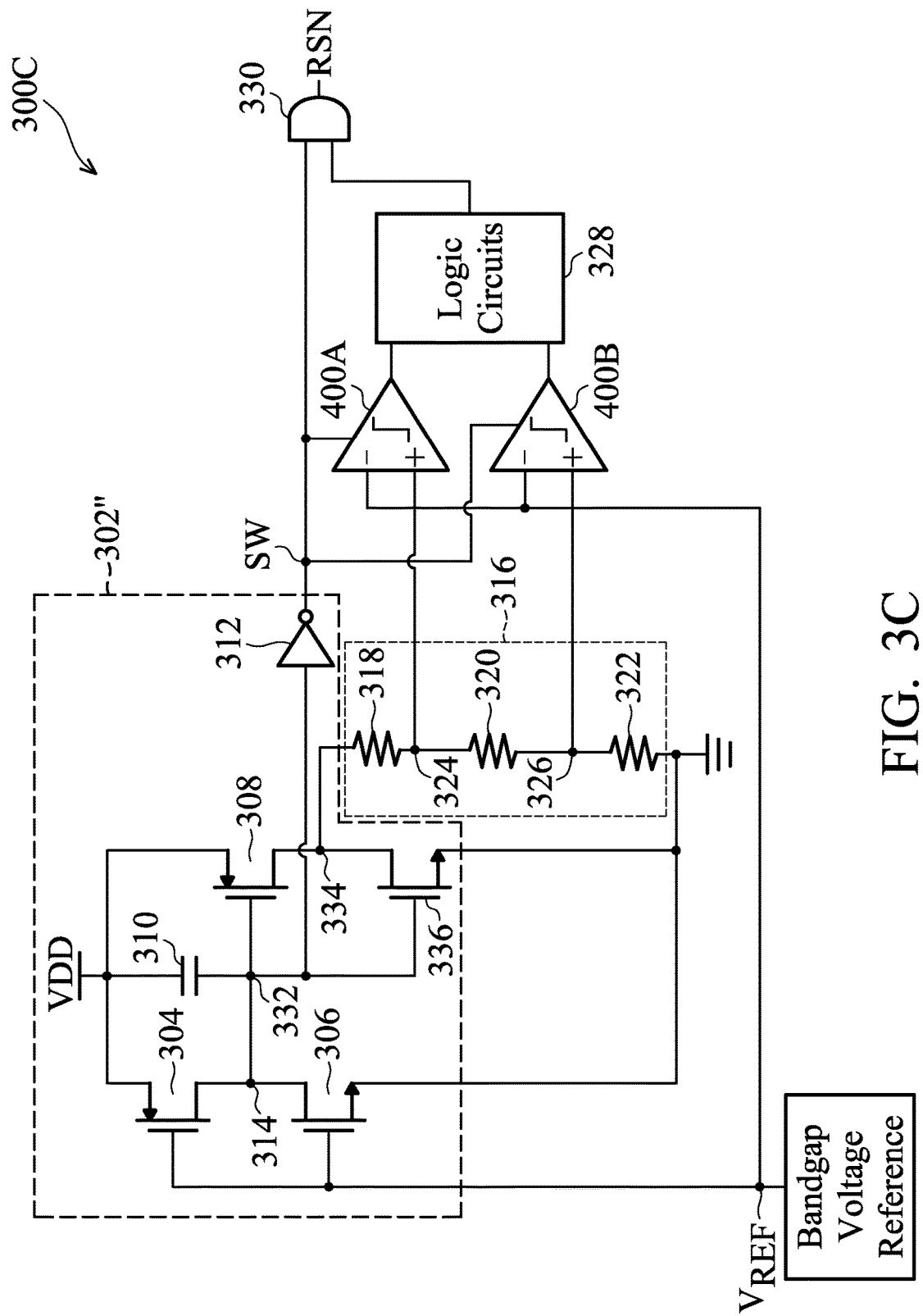
Figure 4A:
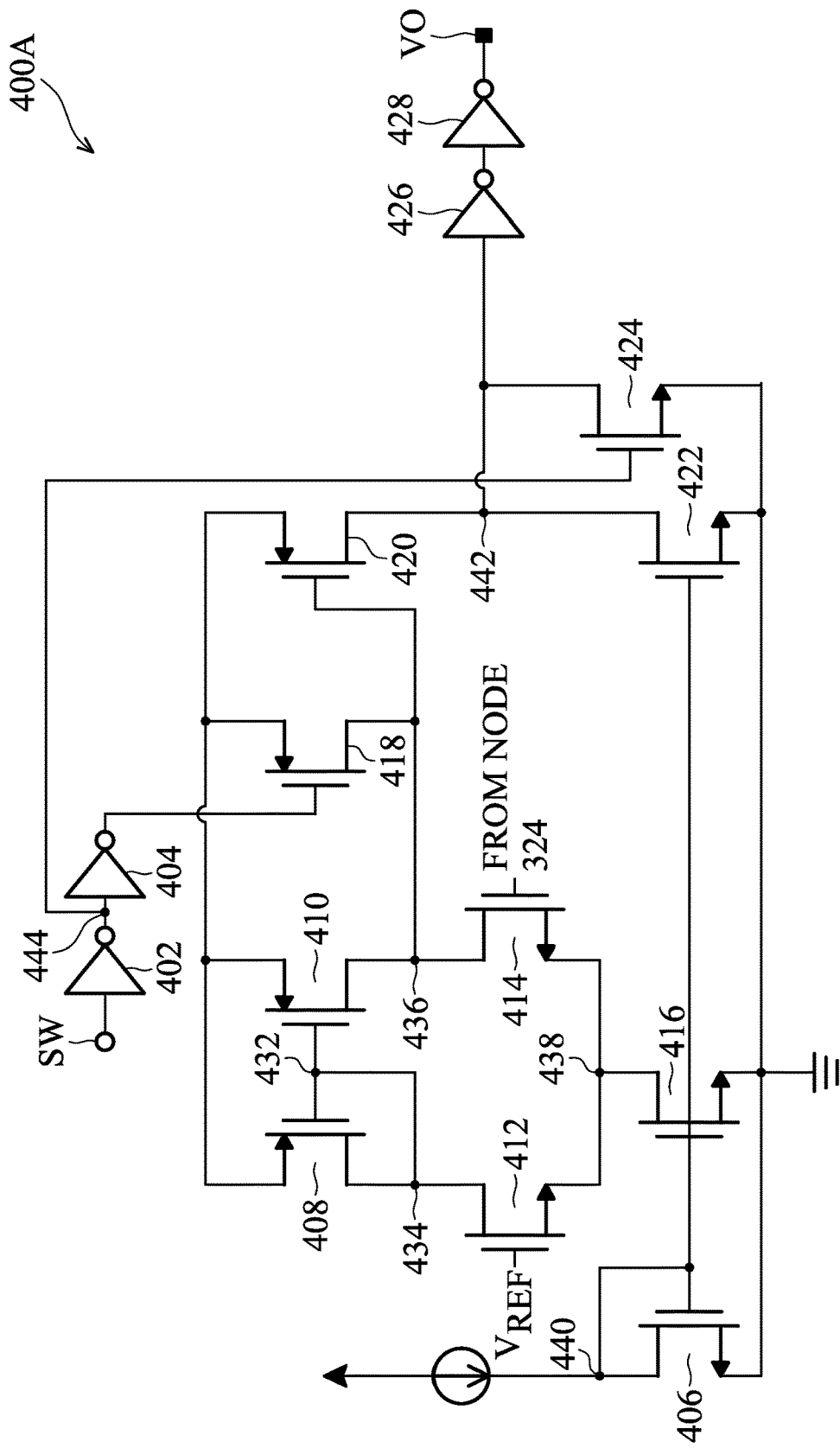
FIGS. 4A and 4B illustrate examples of comparators in accordance with the improved POD circuits illustrated in FIGS. 3A-3C.

FIG. 4A illustrates one example of the comparator 400A in accordance with FIGS. 3A-3C. As illustrated in FIG. 4A, comparator 400A includes first and second inverters 402, 404 coupled together in series. The first inverter 402 receives the output of inverter 312 (shown in FIGS. 3A-3C) as an input. P-channel MOSFET transistor 418 has its source coupled to the sources of transistors 408, 410, and 420, and has its gate coupled to the output of inverter 404. P-channel MOSFET transistors 408 and 410 have their gates coupled together and to the drain of transistor 412 at node 432. N-channel MOSFET transistor 412 receives the reference voltage, VREF, at its gate and has its source coupled to the source of transistor 414 and to the drain of transistor 416 at node 438. The gate of transistor 416 is coupled to the gate and drain of transistor 406, which are coupled to a current source 430 at node 440. The source of transistor 406 is coupled to ground as are the sources of transistors 416, 422, and 424.

The gate of transistor 414 receives a voltage from node 324 as illustrated in FIG. 3A. The drain of transistor 414 is coupled to the drains of transistors 410 and 418 and to the gate of transistor 420 at node 436. The drain of transistor 420 is coupled to the drains of transistors 422 and 424 and to the input of inverter 426 at node 442. The gate of transistor 424 is coupled to the output of inverter 402 and to the input of inverter 404 at node 444. The output of inverter 426 is coupled to the input of inverter 428, and the output of inverter 428 is then input into the logic circuitry 328 as illustrated in FIG. 3A.

Figure 4B:
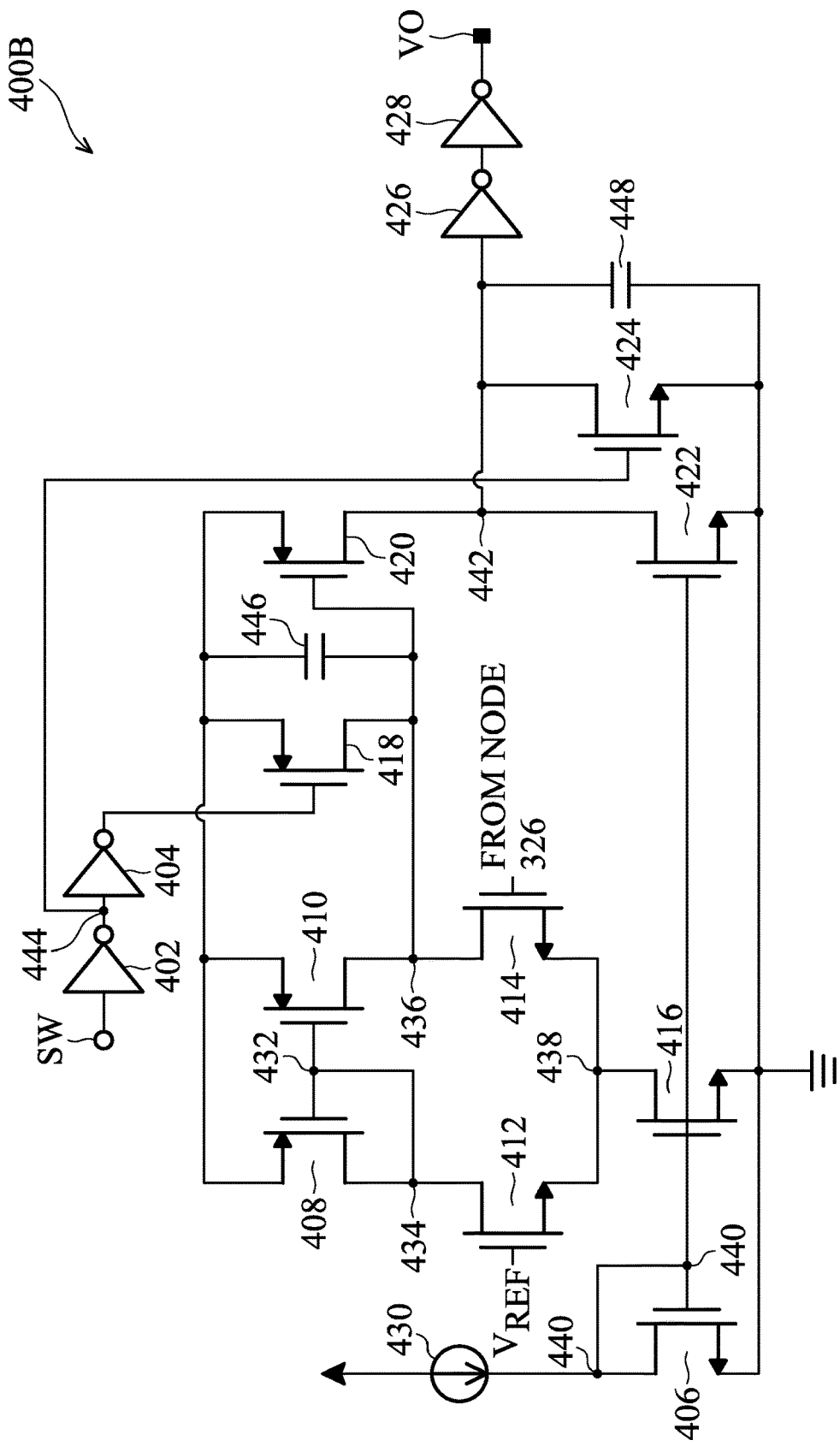

FIG. 4B illustrates one example of the comparator 400B in accordance with FIGS. 3A-3B. Comparator 400B has a similar architecture to comparator 400A and like items are indicated by like reference numerals; descriptions of like items are not repeated. As shown in FIG. 4B, the gate of transistor 414 is coupled to node 326 as seen in FIGS. 3A-3C. Additionally, decoupling capacitors 446 and 448 may be coupled in parallel, e.g., across the source and drain, with transistor 418 and 424, respectively.

FIG. 3C illustrates another example of a POD circuit 300C. As shown in FIG. 3C, the POD circuit 300C has a similar configuration to the POD circuits illustrated in FIGS. 3A and 3B and like items are indicated by like reference numerals; the description of like items is not repeated. The detection circuit 302" includes a transistor 336 having its drain coupled to the drain of transistor 308 and to resistor 318 of the voltage divider 316 at node 334. The source of transistor 336 is coupled to ground, and the gate of transistor 336 is coupled to the drains of transistors 304 and 306, to the gate of transistor 308, and to the input of inverter 312 at node 332.

The operation of the POD circuit 300A is described with reference to FIGS. 3A and 4A. When the device in which the POD circuit is integrated is powered off, VDD will equal approximately zero volts as will the reference voltage, VREF. When the device is turned on, VDD will ramp up to its normal operating voltage level. Capacitor 310 of detection circuit 302 provides VDD to resistor 318 through transistor 308 of voltage divider 316 after a period of time, which is related to the charging time of the capacitor 310. One skilled in the art will understand that the size and charging time of the capacitor 310 may be varied. The delay provided by capacitor 310 advantageously prevents the detection circuit 302 from outputting a VDD through transistor 308 to voltage divider 316 until VREF stabilizes at its steady state voltage.

Once the power on has been detected by detection circuit 302, the voltage potential of voltage source VDD is applied across the voltage divider 316. The detection circuit 302 also controls the turning on of comparators 400A and 400B as it outputs an inverted status signal at node SW through inverter 312. For example, when the detection circuit 302 detects the power is on, e.g., voltage VDD is at its normal operation voltage level above ground potential, it will output a logic "0" to node SW through inverter 312.

As shown in FIG. 4A, inverter 402 receives the signal from node SW and outputs the inverted signal to node 444. Transistor 424 has its gate coupled to node 444 and receives the inverted signal at its gate. Inverter 404 inverts the signal at node 444 and outputs the inverted signal to the gate of transistor 418. Accordingly, the turning on and off of transistors 418 and 424, and consequently the comparator 400A, is controlled by signal output from detection circuit 302 at node SW. With transistors 418 and 424 off, the differential amplifier comprising transistors 408, 410, 412, 414, and 416 outputs a signal based on the voltage difference between the voltage received from node 324 and the reference voltage VREF. For example, if the voltage received from node 324 is greater than the reference voltage VREF, then the comparator 400A may output a logic "1" to the logic circuits 328 through inverter 428. Alternatively, if the voltage received from node 324 is equal to or less than the reference voltage VREF, then the comparator 400A may output a logic "0" to the logic circuitry. One skilled in the art will understand that comparator 400A may be configured to output a logic "1" if the reference voltage is greater than the voltage at node 324 and a logic "0" if the reference voltage is less than the voltage at node 324.

The operation of comparator 400B is similar to the operation of comparator of 400A. For example, inverter 402 of comparator 400B receives the status signal from detector circuit 302' at node SW as shown in FIG. 4B. The output of inverter 402 is received at the gate of transistor 424 controlling the turning on and off of transistor 424. The output of inverter 402 is also inverted by inverter 404, which outputs the inverted signal to the gate of transistor 418 controlling the turning on and off of transistor 418. Capacitors 446 and 448 respectively connected across source and drains of transistors 418 and 426 act as decoupling capacitors to decouple comparator 400B from comparator 400A to avoid false detection. Comparator 400B receives the voltage from node 326 at the gate of transistor 414 and the bandgap reference voltage VREF at the gate of transistor 412 as shown in FIG. 4B. With transistors 418 and 424 of comparator 400B off, the differential amplifier comprising transistors 408, 410, 412, 414, and 416 outputs a signal based on the voltage difference between the voltage received from node 326 and the reference voltage VREF as described above with respect to comparator 400A.

The logic circuitry 328 receives the outputs from comparators 400A and 400B as inputs and outputs a signal to AND gate 330. AND gate 330 receives the output from logic circuitry 328 as an input, along with the status signal output from the detector circuit 302 from node SW. AND gate 330 outputs a signal identifying if the power status, e.g., if the power is on or off, based on the inputs.

Figure 1:
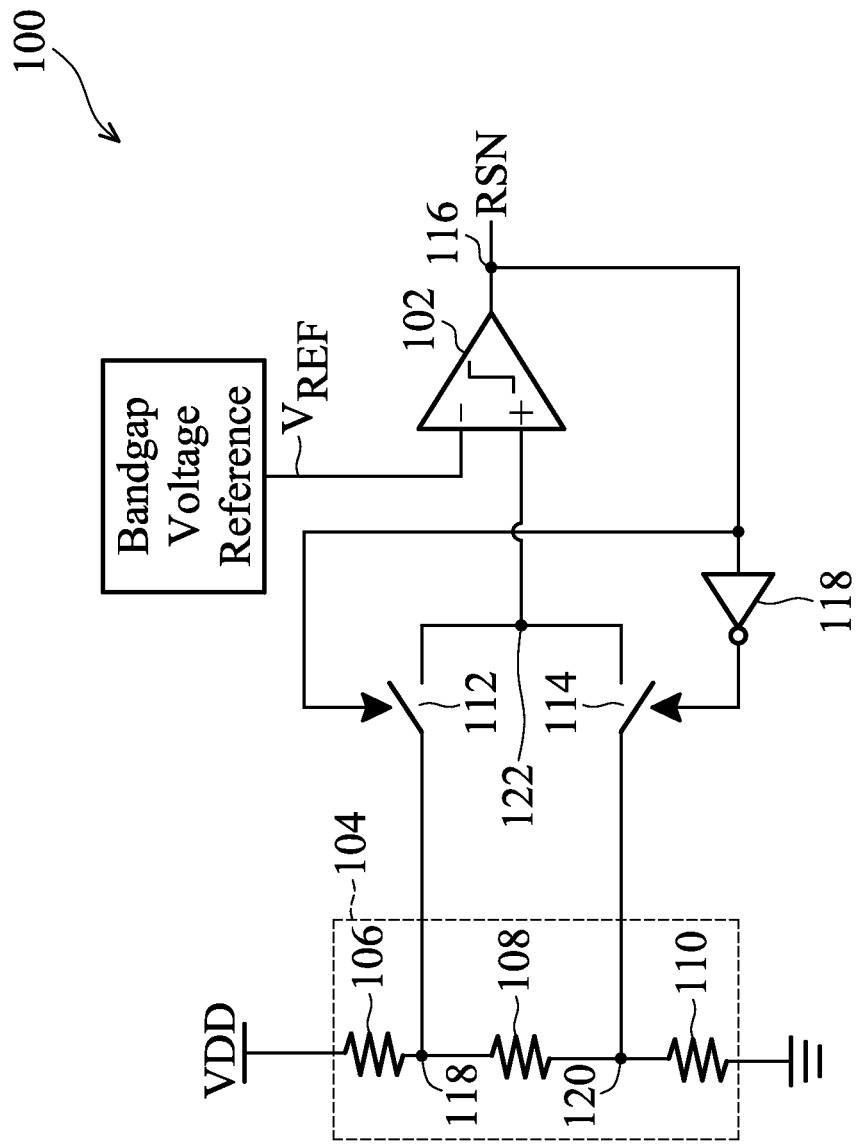
FIG. 1 illustrates one example of a conventional POD circuit.
Figure 2:
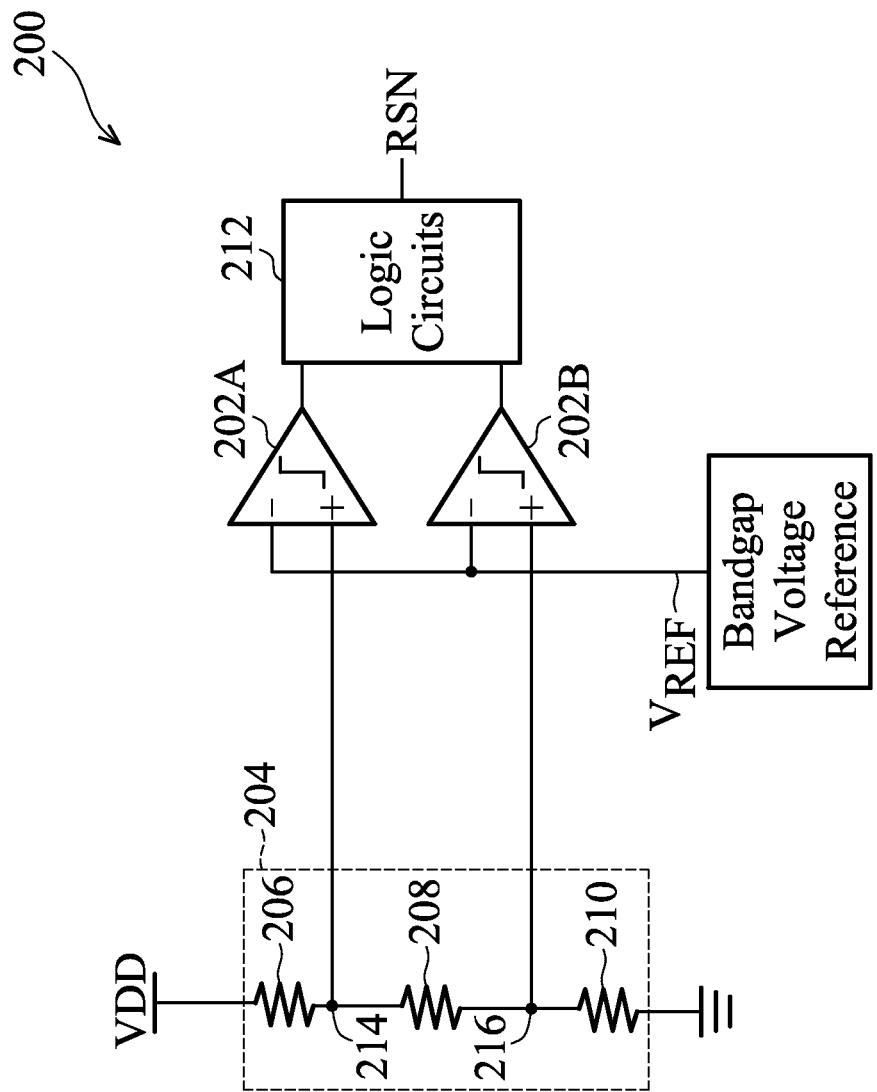
FIG. 2 illustrates another example of a conventional POD circuit.
Figure 5A:
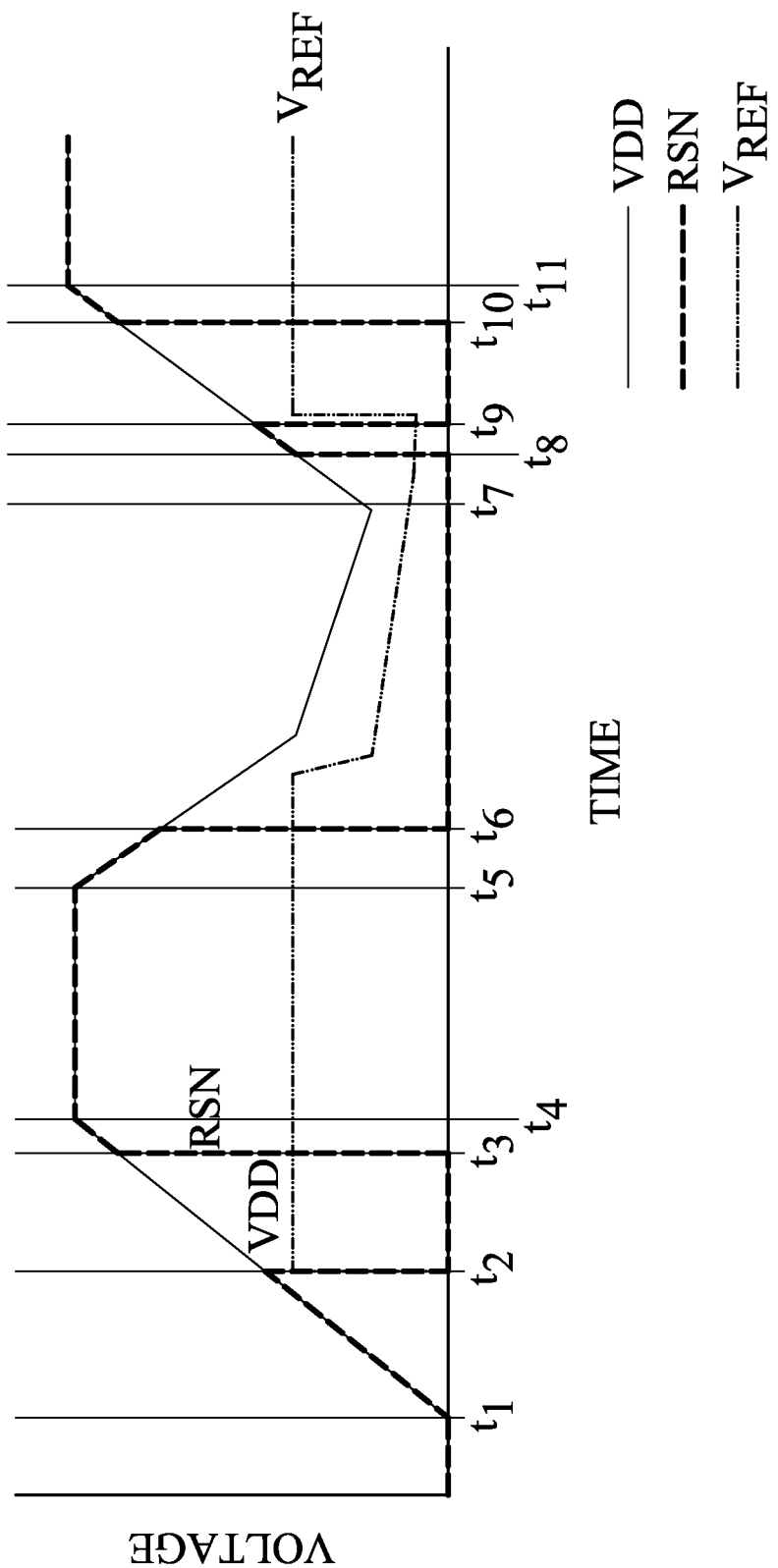
FIG. 5A is a voltage versus time graph of a conventional POD circuit.
Figure 5B:
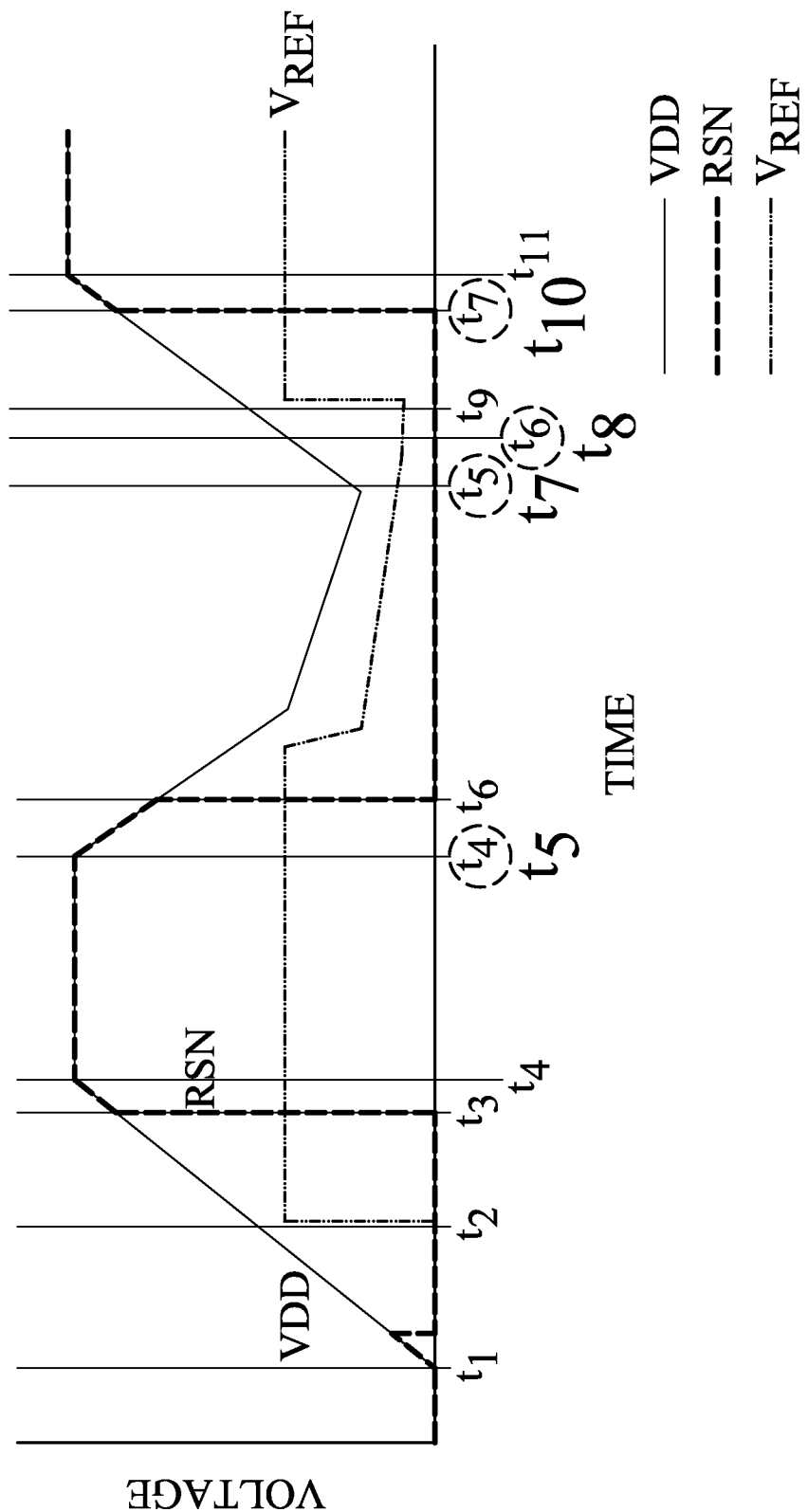
FIG. 5B is a voltage versus time graph of an improved POD circuit.

FIG. 5A illustrates a voltage versus time diagram of a conventional POD circuit, such as the ones illustrated in FIGS. 1 and 2, and FIG. 5B illustrates a voltage versus time diagram of an improved POD circuit 300, such as the ones illustrated in FIGS. 3A-3B. As shown in FIG. 5A, as VDD and the reference voltage VREF ramp up from zero volts toward their normal operating voltages between times $t_1$ and $t_2$. The power on signal RSN also increases between times t1 and t2. At time $t_2$, the power on signal RSN has a voltage identifying a power on state of the device to which the POD circuit 300 is coupled. However, this power on signal is in error as the device is not fully powered until time $t_4$ and thus the power on signal RSN is a false signal.

A similar false signal occurs between times $t_8$ and $t_9$. As shown in FIG. 5A, the power supply VDD powers down between times $t_5$ and $t_7$ and then ramps back up between times $t_7$ and $t_{11}$ during a reset operation. The transitioning of the power supply voltage VDD between times $t_5$ and $t_7$ causes the power on signal RSN to transition to a low signal at time $t_6$ and the reference voltage VREF to be in an unsteady state between times $t_6$ and $t_9$. The false detection of power on signal RSN between times $t_7$ and $t_8$ is a result of the unsteady state of the reference voltage VREF.

FIG. 5B is a voltage versus time diagram of an improved POD circuit 300, such as those illustrated in FIGS. 3A-3C. As shown in FIG. 5B, the power on signal RSN does not increase to as high a voltage compared to the conventional POD circuit during the same period of time, i.e., between $t_1$ and $t_2$. Similarly, a falsely triggered power on signal RSN is not generated during the powering up period between $t_6$ and $t_7$. The improved POD circuit 300 as described herein prevents false detection signal that may occur during power up or reset due to the reference voltage, VREF, being at a voltage level that is less than its steady state voltage.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A power-on-detection (POD) circuit, comprising:
   a detection circuit including:
      a capacitor configured to charge from a first voltage level to a second voltage level;
      a first transistor having a source coupled to a first voltage source node;
      a second transistor having a source and a drain, the drain of the second transistor coupled to a drain of the first transistor;
      a third transistor having a source coupled to the first voltage source node, a drain coupled to a voltage divider circuit, and a gate coupled to the drains of the first and second transistors at a third node that also is coupled to the capacitor; and
      a fourth transistor having a drain coupled to the drain of the third transistor, a gate coupled to the drains of the first and second transistors at the third node and a source coupled to the voltage divider circuit; and
   a first comparison circuit configured to compare a third voltage level to a reference voltage level;
   a second comparison circuit configured to compare a fourth voltage level to the reference voltage level; and
   logic circuitry coupled to an output of the first comparison circuit and to an output of the second comparison circuit, the logic circuitry configured to output a power identification signal based on the outputs of the first and second comparison circuits,
   wherein the third voltage level and the fourth voltage level are based on the second voltage level, and
   wherein the detection circuit is configured to turn on the first and second comparison circuits based on a voltage level of the capacitor.

2. The POD circuit of claim 1, further comprising the voltage divider circuit coupled to the detection circuit and to the first and second comparison circuits, the voltage divider circuit configured to output the third and fourth voltage levels.

3. The POD circuit of claim 1, further comprising the voltage divider circuit, including
   a first resistor coupled to the third transistor of the detection circuit,
   a second resistor coupled to the first resistor at a first node that also is coupled to an input of the first comparison circuit, and
   a third resistor coupled to the second resistor at a second node that also is coupled to an input of the second comparison circuit.

4. The POD circuit of claim 1, wherein the detection circuit includes an inverter having an input coupled to the third node and an output coupled to the first and second comparison circuits.

5. The POD circuit of claim 1, wherein at least one of the first and second transistors configured to receive the reference voltage level at its respective gate.

6. The POD circuit of claim 1, wherein the first comparison circuit includes a differential amplifier for generating an output signal identifying if the third voltage level is greater than the reference voltage level.

7. The POD circuit of claim 1, wherein the second comparison circuit includes a differential amplifier for generating an output signal identifying if the fourth voltage level is greater than the reference voltage level.

8. A power-on-detection (POD) circuit, comprising:
first and second comparator circuits each having first and second inputs, the first inputs of the first and second comparator circuits each receiving a reference voltage from a reference voltage source node;
a voltage divider circuit including a first node and a second node, the first node of the voltage divider circuit coupled to the second input of the first comparator circuit and the second node of the voltage divider circuit coupled to the second input of the second comparator circuit;
a detection circuit including
a first MOS transistor having a source coupled to a first voltage source node,
a second MOS transistor having a source and a drain, the drain of the second MOS transistor coupled to a drain of the first MOS transistor,
a third MOS transistor having a drain coupled to the voltage divider circuit, a source coupled to the first voltage source node, and a gate coupled to the drains of the first and second MOS transistors at a third node,
a fourth MOS transistor having a drain coupled to the drain of the third MOS transistor, a source coupled to the voltage divider circuit, and a gate coupled to the drains of the first and second MOS transistors at the third node, and
a capacitor coupled between the first voltage source node and the third node; and
logic circuitry coupled to an output of each of the first and second comparator circuits, the logic circuitry outputting a power identification signal based on the outputs of the first and second comparator circuits.

9. The POD circuit of claim 8, wherein the voltage divider circuit includes a plurality of resistors coupled between the detection circuit and a second voltage source node.

10. The POD circuit of claim 8, wherein the voltage divider circuit includes
a first resistor coupled to the drain of the third MOS transistor and to the first node;
a second resistor coupled to the first node and to the second node; and
a third resistor coupled to the second node and to a second voltage source node.

11. The POD circuit of claim 8, wherein the detection circuit includes an inverter coupled to the third node and to the first and second comparator circuits.

12. The POD circuit of claim 8, wherein a gate of at least one of the first and second MOS transistors is coupled to the reference voltage source node.

13. The POD circuit of claim 8, wherein the first comparator circuit includes a differential amplifier for generating an output signal identifying if a voltage of the first node of the voltage divider circuit is greater than the reference voltage.

14. The POD circuit of claim 8, wherein the second comparator circuit includes a differential amplifier for generating an output signal identifying if a voltage of the second node of the voltage divider circuit is greater than the reference voltage.

15. The POD circuit of claim 8, wherein the logic circuitry includes an AND gate receiving a control signal as an input.

16. A power-on-detection (POD) circuit, comprising:
first and second comparator circuits each having first and second inputs, the first inputs of the first and second comparator circuits each configured to receive a reference voltage from a reference voltage source node;
a voltage divider circuit including a first node and a second node, the first node of the voltage divider circuit coupled to the second input of the first comparator circuit and the second node of the voltage divider circuit coupled to the second input of the second comparator circuit;
a detection circuit, coupled to a voltage reference circuit, the detection circuit, including:
a capacitor configured to charge from a first voltage level to a second voltage level;
a first transistor coupled to a first voltage source node, the first transistor including a drain and a source, the source of the first transistor coupled to the first voltage source node;
a second transistor coupled to the first transistor, the second transistor including a source and a drain, the drain of the second transistor coupled to the drain of the first transistor;
a third transistor coupled to the first voltage source node, the first and second transistors, and the capacitor, the third transistor including a drain coupled to the voltage divider circuit, a source coupled to the first voltage source node, and a gate coupled to the drains of the first and second transistors at a third node;
a fourth transistor coupled to the first, second, and third transistors, and the capacitor, wherein the fourth transistor includes a drain coupled to the drain of the third transistor, a gate coupled to the drains of the first and second transistors at the third node, and a source coupled to the voltage divider circuit; and
logic circuitry coupled to an output of each of the first and second comparator circuits, the logic circuitry configured to output a power identification signal based on the outputs of the first and second comparator circuits.

17. The POD circuit of claim 16, where the detection circuit includes an inverter having an input coupled to the third node and an output coupled to the first and second comparator circuits.

18. The POD circuit of claim 16, wherein the first comparator circuit is configured to compare a third voltage level at the first node of the voltage divider circuit to a reference voltage level, and the second comparator circuit is configured to compare a fourth voltage level at the second node of the voltage divider circuit to the reference voltage level so as to cause the logic circuitry to output the power identification signal.

* * * * *